(12) United States Patent
Fujino et al.

(10) Patent No.: US 10,978,366 B2
(45) Date of Patent: Apr. 13, 2021

(54) POWER MODULE HAVING A HOLE IN A LEAD FRAME FOR IMPROVED ADHESION WITH A SEALING RESIN, ELECTRIC POWER CONVERSION DEVICE, AND METHOD FOR PRODUCING POWER MODULE

(71) Applicant: MITSUBISHI ELECTRIC CORPORATION, Tokyo (JP)

(72) Inventors: Junji Fujino, Tokyo (JP); Yuji Imoto, Tokyo (JP); Shohei Ogawa, Tokyo (JP); Mikio Ishihara, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/494,815

(22) PCT Filed: Apr. 27, 2018

(86) PCT No.: PCT/JP2018/017134
§ 371 (c)(1),
(2) Date: Sep. 17, 2019

(87) PCT Pub. No.: WO2018/207656
PCT Pub. Date: Nov. 15, 2018

(65) Prior Publication Data
US 2020/0083129 A1 Mar. 12, 2020

(30) Foreign Application Priority Data
May 11, 2017 (JP) .............................. JP2017-094396

(51) Int. Cl.
*H01L 23/495* (2006.01)
*H01L 23/48* (2006.01)
(Continued)

(52) U.S. Cl.
CPC .......... *H01L 23/3121* (2013.01); *H01L 21/56* (2013.01); *H01L 23/15* (2013.01);
(Continued)

(58) Field of Classification Search
CPC ... H01L 23/3121; H01L 23/15; H01L 23/492; H01L 24/32; H01L 24/40;
(Continued)

(56) References Cited

U.S. PATENT DOCUMENTS 5,350,946 A 9/1994 Murakami
5,606,200 A 2/1997 Haraguchi et al.
(Continued)

FOREIGN PATENT DOCUMENTS

JP  H613537 A  1/1994
JP  H0626102 A  9/1994
(Continued)

OTHER PUBLICATIONS

Office Action dated Jul. 7, 2020, issued in corresponding Japanese Patent Application No. 2019-517567, 4 pages including 2 pages of English translation.
(Continued)

*Primary Examiner* — Alonzo Chambliss
(74) *Attorney, Agent, or Firm* — Buchanan Ingersoll & Rooney PC

(57) ABSTRACT

An object is to provide a power module in which adhesion of a sealing resin is sufficient and which is highly reliable. The power module includes: an insulative board in which a pattern of a conductor layer is formed on a ceramic plate; power semiconductor elements placed on the insulative board; lead frames each in a plate shape connecting from electrodes of the power semiconductor elements to screw-fastening terminal portions; and a sealing resin portion that seals connection portions between the power semiconductor
(Continued)

elements and the lead frames, and regions around the connection portions; wherein, in the lead frames, opening portions are formed at positions where each of the lead frames at least partly overlaps, in planar view, with a portion of the insulative board on which the conductor layer is not formed.

19 Claims, 12 Drawing Sheets

(51) Int. Cl.
*H01L 23/28* (2006.01)
*H01L 21/00* (2006.01)
*H01L 23/31* (2006.01)
*H01L 23/15* (2006.01)
*H01L 23/492* (2006.01)
*H01L 23/00* (2006.01)
*H01L 23/498* (2006.01)
*H01L 21/56* (2006.01)

(52) U.S. Cl.
CPC ........ *H01L 23/3107* (2013.01); *H01L 23/492* (2013.01); *H01L 23/49541* (2013.01); *H01L 23/49838* (2013.01); *H01L 24/29* (2013.01); *H01L 24/32* (2013.01); *H01L 24/40* (2013.01); *H01L 2224/32225* (2013.01); *H01L 2224/40137* (2013.01)

(58) Field of Classification Search
CPC ........... H01L 23/49822; H01L 21/4857; H01L 21/486; H01L 23/49838; H01L 21/56; H01L 23/49541; H01L 2924/181; H01L 24/29; H01L 23/3107
See application file for complete search history.

(56) References Cited

U.S. PATENT DOCUMENTS

| | | |
|---|---|---|
| 5,698,898 A | 12/1997 | Matsumoto |
| 2007/0138624 A1 | 6/2007 | Sudo et al. |
| 2008/0150102 A1 | 6/2008 | Yokomae et al. |
| 2012/0256194 A1 | 10/2012 | Yoshihara et al. |
| 2015/0061098 A1 | 3/2015 | Imoto et al. |
| 2015/0371937 A1 | 12/2015 | Yoshihara et al. |
| 2016/0104651 A1* | 4/2016 | Asada ............... H01L 24/37 361/783 |
| 2016/0293563 A1* | 10/2016 | Fujino ............... H01L 24/48 |
| 2016/0300770 A1* | 10/2016 | Taya ............... H01L 24/84 |

FOREIGN PATENT DOCUMENTS

| | | |
|---|---|---|
| JP | H09172116 A | 6/1997 |
| JP | 2003204036 A | 7/2003 |
| JP | 2006202885 A | 8/2006 |
| JP | 2007173272 A | 7/2007 |
| JP | 2008098585 A | 4/2008 |
| JP | 2011114137 A | 6/2011 |
| JP | 2014082274 A | 5/2014 |
| JP | 2015046416 A | 3/2015 |
| JP | 2015133462 A | 7/2015 |
| JP | 2016122869 A | 7/2016 |

OTHER PUBLICATIONS

International Search Report (with English Translation) and Written Opinion dated May 29, 2018, by the Japan Patent Office as the International Searching Authority for International Application No. PCT/JP2018/017134.

\* cited by examiner

POWER MODULE HAVING A HOLE IN A LEAD FRAME FOR IMPROVED ADHESION WITH A SEALING RESIN, ELECTRIC POWER CONVERSION DEVICE, AND METHOD FOR PRODUCING POWER MODULE

TECHNICAL FIELD

The present application relates to a power module and an electric power conversion device that are used in all situations of from power generation and power transmission to efficient use and regeneration of energy, and a method for producing the power module.

BACKGROUND ART

Power modules are well-suited to use with a high voltage and a large current, and are thus becoming widespread over all products from industrial apparatuses to home electronics and information terminals. Recently, with respect to the modules to be installed in the home electronics, they are required to have high productivity and high reliability that allow them to deal with a wide variety of products, as well as to be made compact and lightweight. At the same time, they are also required to have package configurations that are applicable to SiC semiconductors which are highly likely to go mainstream in future because of being high in operation temperature and superior in efficiency. Further, because the power modules each deal with a high voltage and a large current and thus generate a large amount of heat, in many cases, a ceramic plate that is superior in heat conductivity is used as its insulative board in order to efficiently release the heat. Further, according to increase in density of power semiconductor elements, such a method is becoming in use in which an electrode plate (lead frame) is directly soldered to the power semiconductor element in order to form a high current-density circuit.

The power module of the thus-provided configuration is, in many cases, sealed in an insulated manner with a sealing resin made of an epoxy resin; however, because the degree of adhesion of the sealing resin to the power module is generally low, UV radiation is applied in some cases in order to improve such a situation. In these cases, because the electrode plate of Cu tends to become wider in order to deal with the elevation in voltage and increase in current of the power module, it is difficult to radiate UV light to a shaded region developed by that electrode plate (mostly, by an in-casing root portion of the Cu electrode plate), so that there is concern that the productivity will be affected if the UV radiation time is increased or the reliability will be affected due to insufficient adhesion of the sealing resin. In regard to this, formation of an opening portion in the electrode plate is proposed in Patent Document 1.

CITATION LIST

Patent Document

Patent Document 1: Japanese Patent Application Laid-open No. 2015-046416 (Paragraphs 0100 to 0109; FIG. 17, FIG. 18)

SUMMARY OF THE INVENTION

Problems to be Solved by the Invention

However, according to Patent Document 1, its object is to enhance an adhesive force of the sealing resin by improving its sticking property to the front and back of the electrode plate and thus, there is a problem that adhesion of the sealing resin is insufficient in particular to the ceramic of the ceramic board.

The present application has been made in order to solve the problem as described above, and an object thereof is to provide a power module and an electric power conversion device in which adhesion of the sealing resin is sufficient and which are highly reliable, and a method for producing the power module.

Means for Solving the Problems

A power module disclosed in this application is characterized by comprising: an insulative board in which patterns of conductor layers are formed on both sides of a ceramic plate; a semiconductor element placed on the insulative board; an electrode plate in a plate shape connecting from an electrode of the semiconductor element to outside thereof; and a sealing resin portion that seals a connection portion between the semiconductor element and the electrode plate, and a region around the connection portion; wherein an opening portion is formed in the electrode plate at a position where the opening portion at least partly overlaps, in planar view, with a portion of the insulative board where the conductor layer is not formed.

Further, a power module disclosed in this application is characterized by comprising: an insulative board in which patterns of conductor layers are formed on both sides of a ceramic plate; a semiconductor element placed on the insulative board; an electrode plate in a plate shape connecting from an electrode of the semiconductor element to outside thereof; and a sealing resin portion that seals a connection portion between the semiconductor element and the electrode plate, and a region around the connection portion; wherein a bent portion is formed in the electrode plate at a position where the bent portion at least partly overlaps, in planar view, with a portion of the insulative board where the conductor layer is not formed; said bent portion being bent at a specified angle with respect to formation direction of the electrode plate, in a direction perpendicular to the insulative board.

A method for producing a power module, disclosed in this application is characterized by including: a step of bonding a semiconductor element onto an insulative board in which patterns of conductor layers are formed on both sides of a ceramic plate; a step of bonding together an electrode of the semiconductor element and an electrode plate in a plate shape, said electrode plate having an opening portion formed at a position where the opening portion at least partly overlaps, in planar view, with a portion of the insulative board where the conductor layer is not formed; and a step of pouring a sealing resin to a connection portion between the semiconductor element and the electrode plate, and a region around the connection portion, in a state where a surface of an area of the insulative board other than an area thereof where the conductor layer is formed, is excited by radiation of UV light, to thereby seal said connection portion and said region.

Effect of the Invention

According to the present application, the opening portion having a specified size is formed at a position where the electrode plate overlaps the insulative board, so that it is possible to radiate UV light through the opening portion also to a ceramic portion of the insulative board placed on the back side of the lead frame, to thereby enhance the adhesive strength of the sealing resin to the ceramic.

MODES FOR CARRYING OUT THE INVENTION

Embodiment 1

Figure 1:
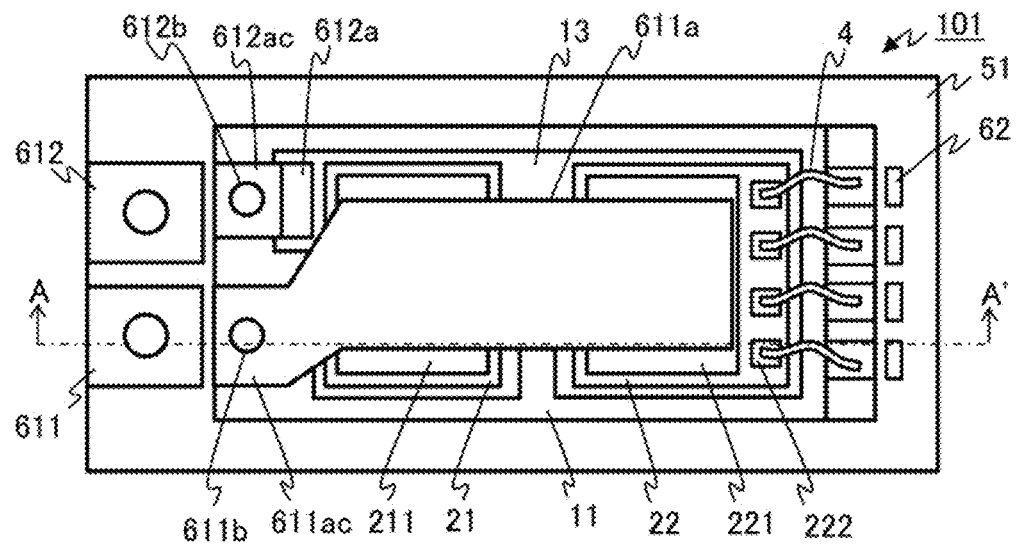
FIG. 1 is a top view showing a configuration of a power module according to Embodiment 1.
Figure 2:
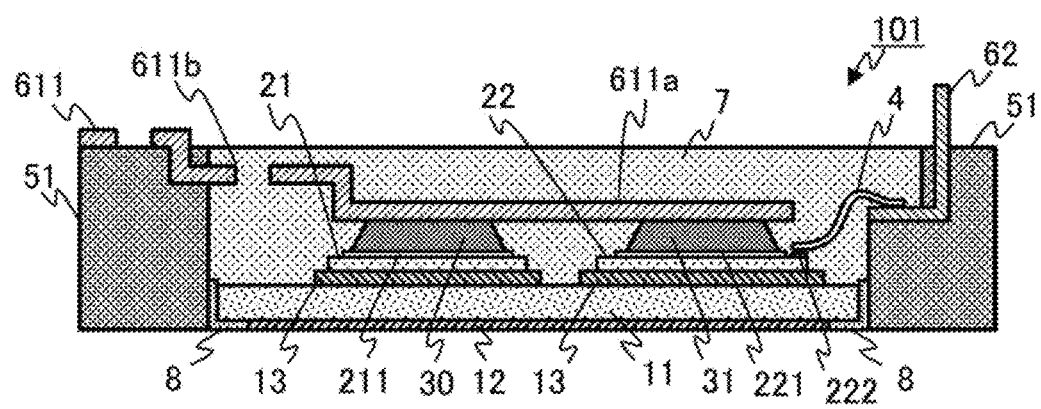
FIG. 2 is a sectional view showing a configuration of the power module according to Embodiment 1.
Figure 3:
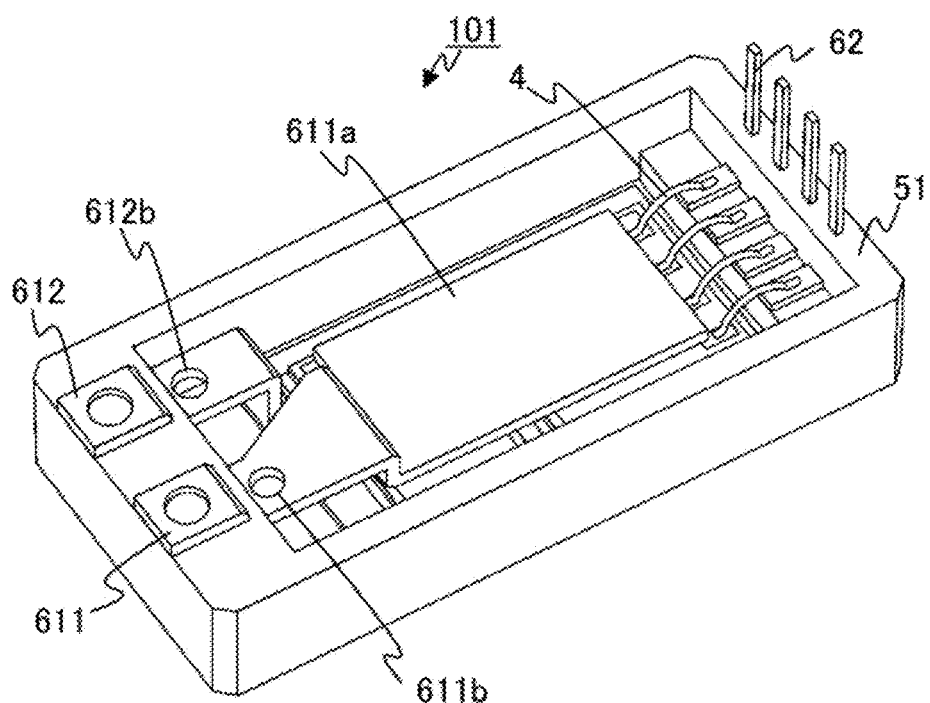
FIG. 3 is a perspective view of the power module according to Embodiment 1.

FIG. 1 to FIG. 3 are diagrams showing a configuration of a power module 101 according to Embodiment 1. FIG. 1 is a top view, FIG. 2 is a sectional view seen in the direction of arrows along the line A-A' in FIG. 1, and FIG. 3 is a perspective view (without its sealing resin). As shown in FIG. 1 to FIG. 3, the power module 101 is configured with: an insulative board 11; power semiconductor elements 21, 22 placed on the insulative board 11; a lead frame 611a as a main terminal electrically connected to electrodes of the power semiconductor elements 21, 22; lead frames as signal terminals electrically connected through wires 4 to the power semiconductor element 22; and a sealing resin portion 7 that seals these power semiconductor elements 21, 22 and regions around portions where they are connected.

As the insulative board 11, an aluminum nitride (AlN) board (for example, 40 mm×25 mm (outline dimension)×0.6 mm (thickness)), that is a ceramic plate, is used. On the back surface of the insulative board 11, a conductor layer 12 made of Cu (for example, a pattern thickness of 0.4 mm) is formed as a back-surface electrode. On the front surface of the insulative board 11, a conductor layer 13 made of Cu (for example, a pattern thickness of 0.4 mm) is formed, and the power semiconductor elements 21, 22 are placed on the conductor layer 13.

It is noted that the insulative board 11 is not limited to the AlN board so long as insulation can be ensured thereby and a solder-wettable conductor layer of such as Cu can be formed thereon, so that, as the ceramic plate, an insulative-board base member of, for example, alumina ($Al_2O_3$), silicon carbide (SiC), silicon nitride ($Si_3N_4$) or the like, may be used.

Further, the conductor layer 12 just has to be solder-wettable, and it suffices that its outermost surface is metal which is not limited to Cu and may be Sn, Au, Ag or the like. Further, a front-surface electrode and a back-surface electrode of each of the power semiconductor elements 21, 22 just have to be solder-wettable metal, and it suffices that its outermost surface is Sn, Au, Ag or the like.

As the power semiconductor elements 21, 22, a diode (for example, 15 mm×15 mm (outline dimension)×0.3 mm (thickness)) and an IGBT (Insulated Gate Bipolar Transistor; for example, 15 mm×15 mm (outline dimension)×0.3 mm (thickness)) made of Si are used, respectively, and they are fixed adhesively onto the conductor layer 13 by die bonding using a solder (not shown). In another case, a power semiconductor, such as an IC (Integrated Circuit) or a MOSFET (Metal-Oxide-Semiconductor Field-Effect Transistor) may be used. Further, a module configuration of 1-in-1 is herein provided in which one pair of the diode and the IGBT is formed; however, a module configuration of 2-in-1 in which two pairs are formed or 6-in-1 in which six pairs are formed, may instead be provided.

The lead frame 611a comprises an electrode plate made of Cu (for example, a thickness of 0.6 mm), and is fixed adhesively to main circuit electrodes 211, 221 as front-surface electrodes formed on the front surfaces of the power semiconductor elements 21, 22, by way of solder-bonding portions 30, 31, respectively, so that the lead frame is electrically connected to respective source electrodes. At one of end portions of the lead frame 611a, a screw-fastening terminal portion 611 is formed, which is fixed to a casing 51, as a main terminal (for example, a width of 10 mm and a thickness of 0.6 mm).

It is noted that a solder is used for making connections between the power semiconductor element 21, 22 and the insulative board 11 and connections between the lead frame 611a and the power semiconductor elements 21, 22; however, an electroconductive adhesive agent in which Ag fillers are dispersed in an epoxy resin, or an Ag nano-powder or Cu nano-powder whose nanoparticles are to be fired at a low temperature, or the like, may instead be used.

The lead frames 62 each comprise an electrode plate made of Cu, and are wire-bonded by way of wires 4 (φ0.15 mm) made of Al to control electrodes 222 as front-surface electrodes formed on the front surface of the power semiconductor element 22, namely, IGBT, so that the lead frames are electrically connected to a gate electrode, a temperature-sensor electrode and the like. The lead frames 62 are fixed to the casing 51 as signal terminals.

It is noted that the wire made of Al is herein used for wire-bonding; however, a wire made of Cu, an Al-covered Cu wire or an Au wire may instead be used. Further, a bonding ribbon, a bus bar as an ultrasonically-bonded metal plate or the like may instead be used. Further, it is also allowable that the lead frame 62 is made of Al and metallization is applied thereon by plating of Cu or the like.

The casing 51 (for example, 48 mm×28 mm (outline dimension)×12 mm (height)) is made of a PPS (Poly Phenylene Sulfide) resin and is formed into a frame shape. The insulative board 11 is fixed adhesively to the bottom of the casing 51 by using an adhesive agent 8 (made of silicone) so that the conductor layer 12 is exposed to the outside.

Together with the screw-fastening terminal portion 611, a screw-fastening terminal portion 612 is fixed as the other main terminal to the casing 51. A lead frame 612a is ultrasonically bonded directly to the conductor layer 13 on the insulative board 11, so that the screw-fastening terminal portion 612 is electrically connected through the respective back-surface electrodes (not shown) of the power semiconductor elements 21, 22 to their respective drain electrodes. The screw-fastening terminal portions 611, 612 may be subjected to Cu plating or Ni plating, if necessary. Note that although a PPS resin is used as the material of the casing 51, an LCP (Liquid Crystal Polymer) resin may instead be used.

In root portions of the lead frame 611a and the lead frame 612a, that project from the casing 51 near the screw-fastening terminal portions 611, 612, circular opening portions 611b, 612b each having a diameter of 2 mm are formed, respectively, and the opening portions 611b, 612b are formed so that, in planar view, a ceramic portion 11a of the insulative board 11 where no conductor layer is provided, overlaps with them. They are formed so that the ceramic portion is exposed (can be seen). At the time the surface to be made contact with the sealing resin is subjected to surface modification by UV treatment before formation of the sealing resin portion 7, the provision of the opening portions 611b, 612b makes it possible to radiate UV light also to the ceramic portion of the insulative board 11 placed on the back side of the root portions of the lead frame 611a and the lead frame 612a, through the opening portions 611b, 612b. Thus, it is possible to enhance the adhesive strength of the sealing resin to the ceramic.

Figure 4:
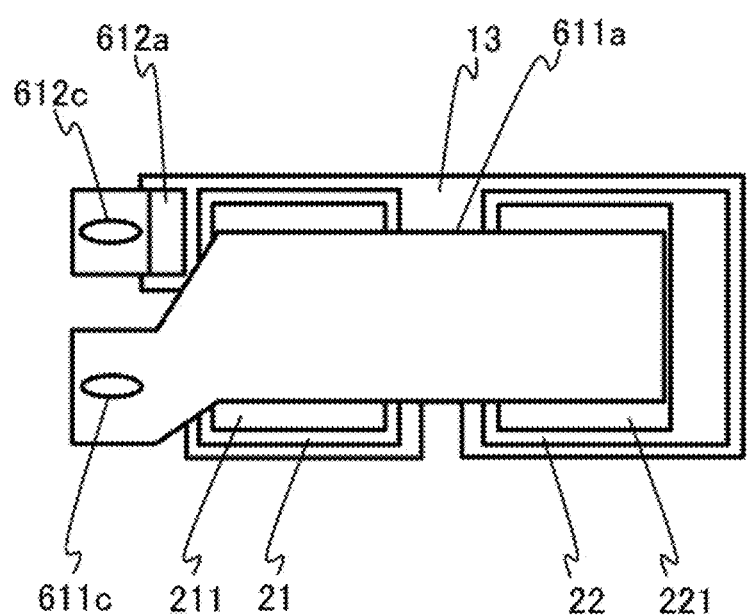
FIG. 4 is a partial top view showing another configuration of a power module according to Embodiment 1.

It is noted that, in Embodiment 1, the opening portions 611b, 612b are described to be circular; however, this is not limitative. For example, the opening portions may be elliptic or oval, having areas equivalent to the opening portions 611b, 612b and having long axes in a direction in which the lead frame 611a and the lead frame 612a are formed. Also when the opening portion is quadrangular with rounded corners, an effect similar to the above is achieved. FIG. 4 shows the lead frame 611a and the lead frame 612a having elliptic opening portions 611c, 612c in the root portions. When the elliptic opening portions 611c, 612c are formed that are long in the longitudinal direction of the frames, it becomes also possible to enlarge each of the opening portions without reducing the cross-section area of the frame across the direction of flow of large current.

The sealing resin portion 7 is formed by a potting resin, and seals in an insulating manner the front surface of the insulative board 11; the conductor layer 13; the power semiconductor elements 21, 22; the lead frames 611a, 612a; the lead frames 62; the wires 4; and the solder-bonding portions 30, 31. As the potting resin, such a material is used in which fillers of silica or the like are dispersed in an epoxy resin. The fillers are not limited to those of silica, so that alumina, BN or the like may be used therefor.

The power module 101 generates a large amount of heat because a large current flows therein, so that, for the purpose of efficiently releasing heat, the ceramic plate made of AlN that is superior in heat conductivity is used as the insulative board 11. Furthermore, there is provided a configuration in which the lead frame 611a made of Cu is soldered directly to the power semiconductor elements 21, 22.

The thermal expansion coefficient of the lead frame 611a made of Cu is 17 ppm/K, whereas the thermal expansion coefficient of each of the power semiconductor elements 21, 22 to be bonded thereto is 3 to 3.5 ppm/K, and the thermal expansion coefficient of the insulative board 11 made of AlN on which the power semiconductor elements 21, 22 are mounted is, together with the conductor layers 12, 13 on both sides thereof, approx. 10 ppm/K as a whole.

Although a material in which fillers of silica or the like are dispersed in an epoxy resin is used as for the sealing resin portion 7 in many cases, the expansion coefficient thereof after curing is adjusted to between that of Cu of the lead frame 611a and that of the insulative board 11 in many cases. Because of a thermal stress due to such a difference in expansion coefficient, peeling or the like is likely to occur at a peripheral portion thereof under a temperature cycle; however, under that peripheral portion, there is the ceramic portion that is a portion of the insulative board where no conductor layer is provided, and the ceramic portion is in contact with the epoxy resin. The adhesion between the epoxy resin and the ceramic is generally low, so that, when there is a difference in the expansion coefficient therebetween, it is particularly important to increase the adhesive force, in order to ensure the reliability.

For that reason, the adhesion is improved by UV radiation before injection of the sealing resin; however, because the lead frames 611a, 612a tend to become wider in order to deal with the elevation in voltage and increase in current of the power module, it is difficult to radiate UV light to shaded regions developed by these frames (mostly, by the in-casing root portions 611ac, 612ac of the lead frames 611a, 612a), so that there is concern that the productivity will be affected if the UV radiation time is increased or the reliability will be affected due to insufficient adhesion of the sealing resin.

The present application is characterized in that an opening portion is formed in the lead frame, at a position where the electrode plate overlaps the insulative board, and at around a width-direction center near the in-casing root of the lead frame, to thereby suppress shielding of UV light and thus to improve the adhesion of the sealing resin to the ceramic beneath the lead frame.

Next, a method for producing the power module 101 according to Embodiment 1 will be described based on FIG. 5A, FIG. 5B, FIG. 5C, FIG. 5D and FIG. 5E. FIG. 5A, FIG. 5B, FIG. 5C, FIG. 5D and FIG. 5E are sectional views showing fabrication steps of the power module 101 according to Embodiment 1.

Figure 5A:
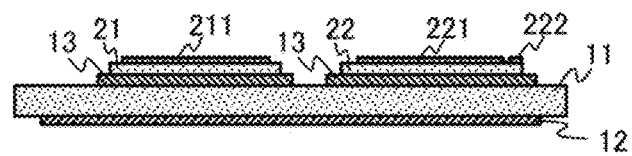
FIG. 5A, FIG. 5B, FIG. 5C, FIG. 5D and FIG. 5E are sectional views showing fabrication steps of a power module according to Embodiment 1.

First, as shown in FIG. 5A, onto the conductor layer 13 placed on the front surface of the insulative board 11 in which the conductor layers 12, 13 are formed on both sides thereof, the power semiconductor element 21 that is a diode and the power semiconductor element 22 that is an IGBT are fixed adhesively by die bonding using a solder (not shown), to thereby electrically connect that conductor layer to the respective back-surface electrodes (not shown) of the power semiconductor elements 21, 22. On the front surface of the power semiconductor element 21, the main circuit electrode 211 is formed; on the front surface of the power semiconductor element 22, the main circuit electrode 221 and the control electrodes 222 are formed; and on their respective back surfaces, the back-surface electrodes are formed.

Figure 5B:
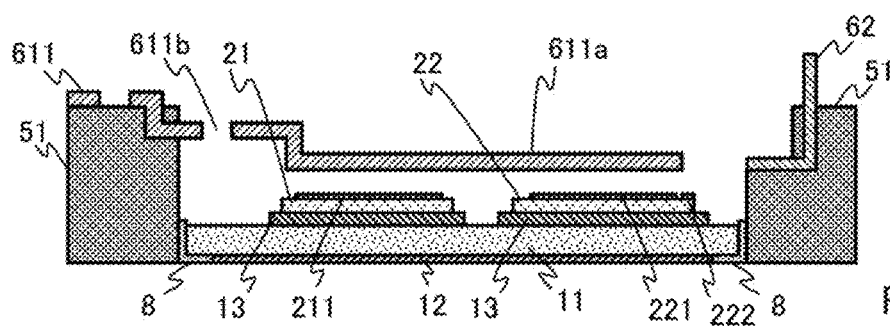

Subsequently, as shown in FIG. 5B, the insulative board 11 is fixed adhesively to the bottom of the frame-shaped casing 51 by using the adhesive agent 8 (made of silicone) so that the conductor layer 12 is exposed to the outside. When the adhesive agent 8 is filled in a gap between the insulative board 11 and the casing 51, it is also possible to prevent the potting resin charged in the casing 51 in a later step (FIG. 5E) from leaking out.

In the casing 51, the lead frame 611a is disposed beforehand by insert molding on the upper side in the casing frame so that the screw-fastening terminal portion 611 as the end portion thereof is fixed to the upper side of the casing 51. Further, to the upper side of the casing 51, together with the screw-fastening terminal portion 611, the screw-fastening terminal portion 612 (see, FIG. 1) as the other main terminal is fixed beforehand by insert molding.

Furthermore, to the upper side of the casing 51, the lead frames 62 are fixed beforehand by insert molding. Because the insulative board 11 is fixed to the bottom of the casing 51, the lead frames 62 are placed at positions matched with the control electrodes 222 on the front surface of the power semiconductor element 22.

Figure 5C:
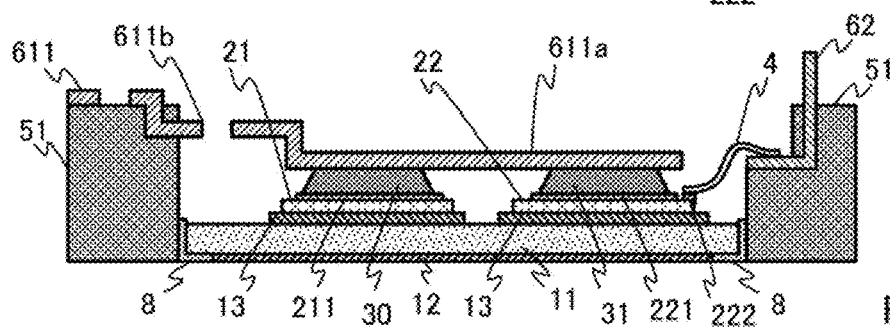

Then, as shown in FIG. 5C, using a solder, the lead frame 611a is fixed adhesively to the respective main circuit electrodes 211, 221 of the power semiconductor elements 21, 22, so that the solder-bonding portions 30, 31 are formed. This causes the screw-fastening terminal portion 611 of the lead frame 611a to be electrically connected to the respective source electrodes through the respective main circuit electrodes 211, 221 of the power semiconductor elements 21, 22.

The lead frame 612a is ultrasonically bonded directly to the conductor layer 13 on the insulative board 11, so that the screw-fastening terminal portion 612 is electrically connected through the respective back-surface electrodes of the power semiconductor elements 21, 22 to the respective drain electrodes. In this manner, the electrodes, such as the respective source electrodes and the respective drain electrodes of the power semiconductor elements 21, 22 and the like, through which the large current will flow, are connected to the screw-fastening portions 611, 612 as the main terminals.

In the root portions that project from the casing 51 near the screw-fastening terminal portions 611, 612, and at positions where the lead frame 611a and the lead frame 612a overlap the insulative board 11, the circular opening portions 611b, 612b each having a diameter of 2 mm are formed, respectively, and the opening portions 611b, 612b are formed so that the ceramic portion of the insulative board 11 is exposed (can be seen).

The lead frames 62 are wire-bonded by way of the wires 4 made of Al to the control electrodes 222 on the front surface of the power semiconductor element 22. This causes the lead frames 62 to be electrically connected, as signal terminals, to the gate electrode, the temperature-sensor electrode and the like, through the control electrodes 222 of the power semiconductor element 22 as an IGBT.

Figure 5D:
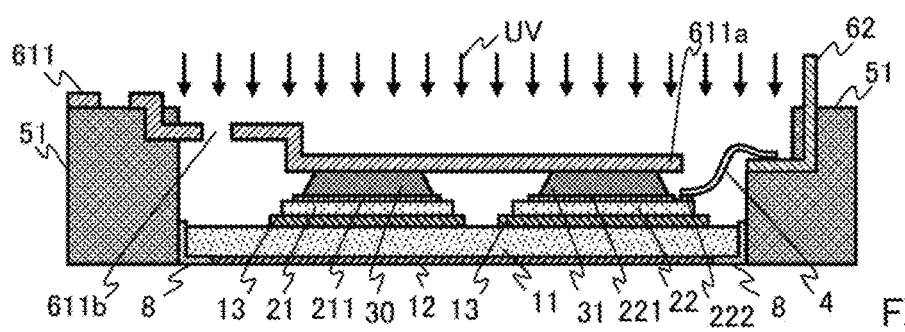

Subsequently, as shown in FIG. 5D, UV radiation is applied to the surface to be made contact with the sealing resin when the sealing resin is injected in the casing 51. On this occasion, because the opening portions 611b, 612b are formed, it is possible to radiate UV light through the opening portions 611b, 612b also to the ceramic portion of the insulative board 11 placed on the back side of the root portions, at the positions where the lead frame 611a and the lead frame 612a overlap the insulative board 11. This makes it possible to enhance the adhesive strength of the sealing resin to the ceramic.

Figure 5E:
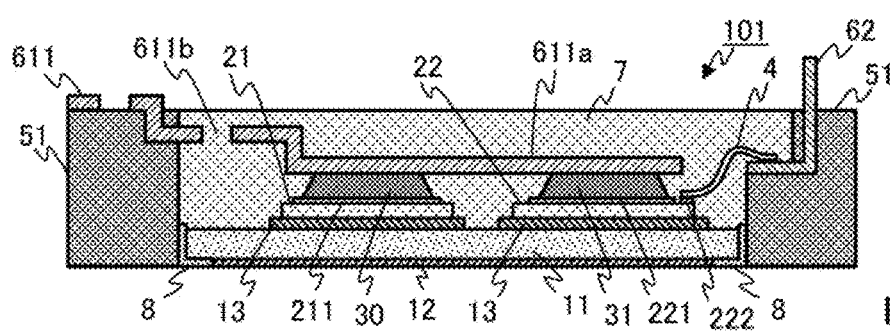

Lastly, as shown in FIG. 5E, in an excitation state where the surface of the ceramic plate is activated by UV radiation and before a UV-irradiation mark (color-change by irradiation) on the ceramic plate disappears, the sealing resin for direct potting is poured in a state heated to 60° C., which is then defoamed in vacuum and heated (100° C., 1.5 hours→140° C., 1.5 hours), so that it is cured to form the sealing resin portion 7 and thus the power module 101 is completed.

Figure 6:
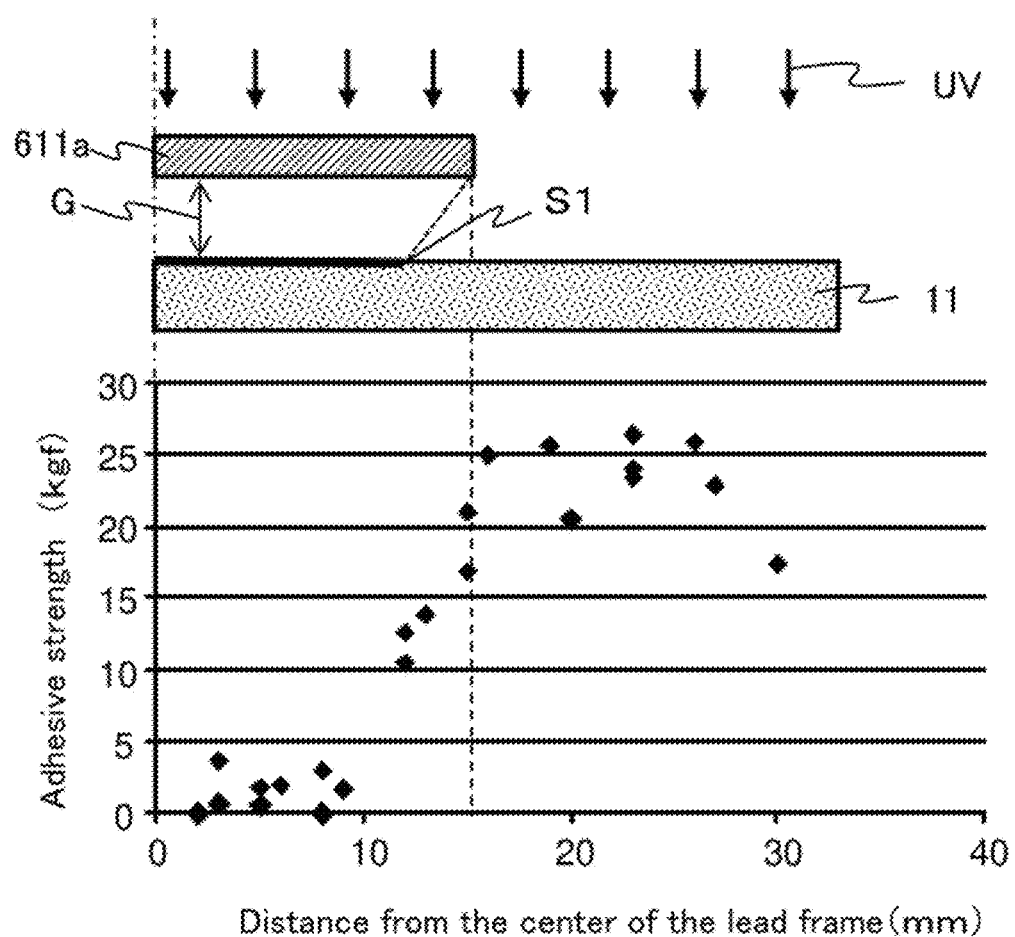
FIG. 6 is a diagram showing a relationship of an adhesive strength with respect to an opening portion of a conventional power module.

In FIG. 6, a conventional lead frame 611a in which no opening portion is formed, positions in the insulative board 11 and actually-measured values of the adhesive strength are shown. As shown in FIG. 6, at a position near the end of the region shaded by the lead frame 611a, the adhesion was not so affected because the UV light had intruded thereto; however, when a gap G between the lead frame 611a and the insulative board 11 is 2 mm, the adhesion was decreased to about 50% at the portion Si shifted by 2 mm toward the center of the lead frame from its end. Furthermore, almost no adhesion was achieved at a portion shifted by 5 mm or more.

Figure 7:
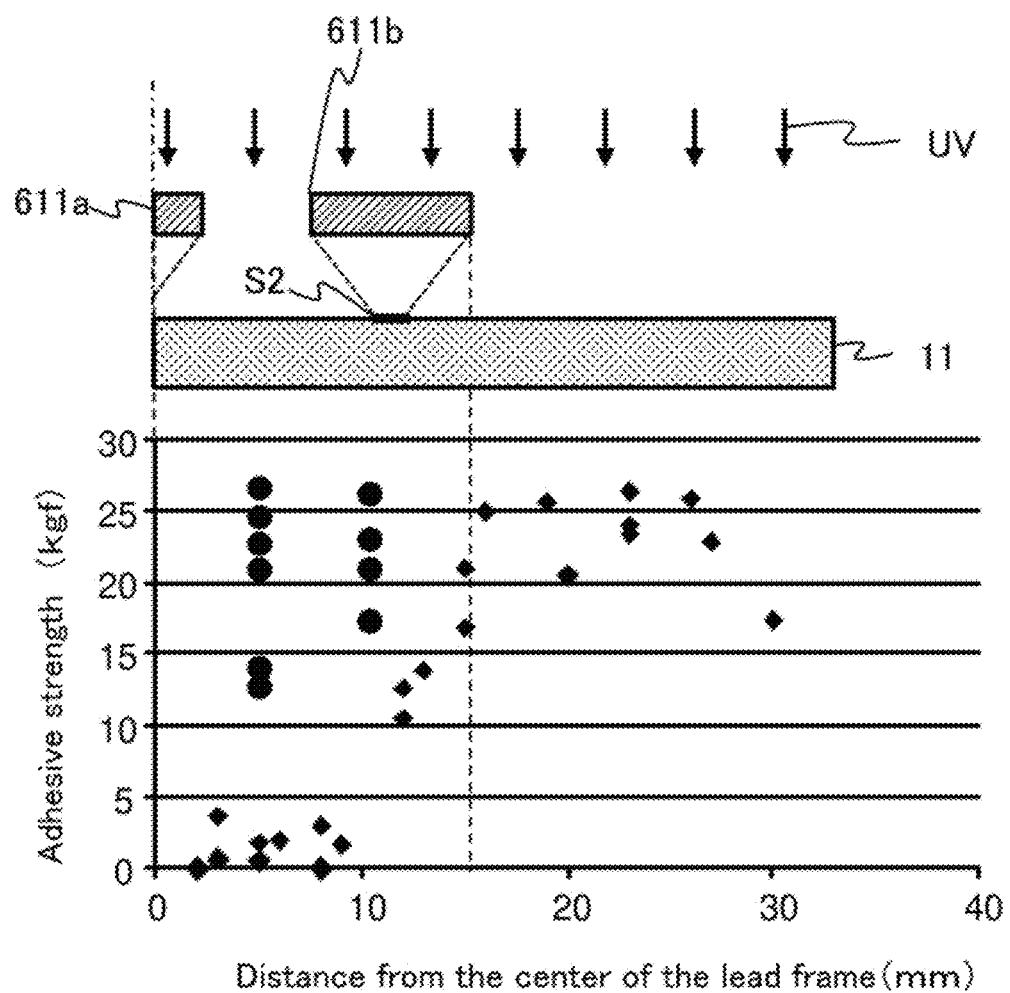
FIG. 7 is a diagram showing a relationship of an adhesive strength with respect to an opening portion of the power module according to Embodiment 1.

By comparison, in FIG. 7, the lead frame 611a according to Embodiment 1 in which the opening portion is formed, positions in the insulative board 11 and actually-measured values of the adhesive strength are shown. As shown in FIG. 7, when the opening portion having a diameter of 2 mm was formed at a position 10 mm apart from the end, the average value of the adhesive strengths beneath the opening portion was about 80%. Further, it is found that about 80% was also ensured as the average value of the adhesive strengths at a portion shifted by 5 mm from the end. This clearly indicates that the opening portion suppresses shielding of UV light. According to the above results, it is thought that, when the lead frame 611a has a width equal to or more than twice the gap between the lead frame and the insulative board 11, the opening portion particularly exhibits the suppression effect of UV shielding.

Figure 8:
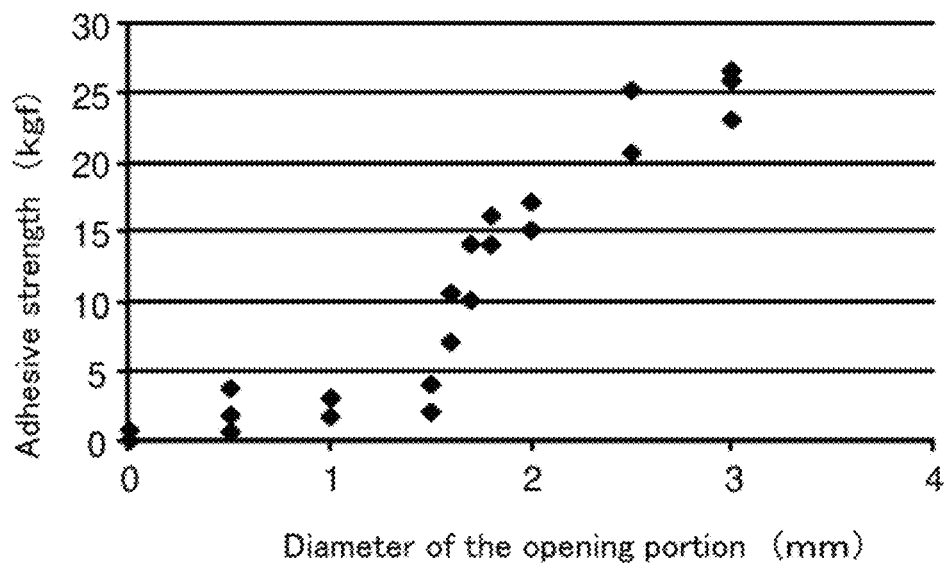
FIG. 8 is a diagram showing a relationship between a diameter of the opening portion of the power module and an adhesive strength, according to Embodiment 1.

In FIG. 8, diameters of the opening portion formed in the lead frame 611a and actually-measured values of the adhesive strength beneath the opening portion are shown. Here, the thickness of the lead frame was set to 1 mm. As shown in FIG. 8, it is found that, until the diameter of the opening portion becomes 150% relative to the thickness 1 mm of the lead frame, the adhesive strength is almost unimproved; however, at the diameters not less than 160%, the adhesive strength is increased gradually, and when the diameter of the opening portion becomes 250%, the adhesive strength is improved to a level not much different from that of the exposed portion. Accordingly, the diameter of the opening portion is preferably not less than 160% but not more than 250% relative to the thickness of the lead frame.

As described above, according to the power module 101 according to Embodiment 1, it comprises: the insulative board 11 in which a pattern of the conductor layer 13 is formed on a ceramic plate; the power semiconductor elements 21, 22 placed on the insulative board 11; the plate-like lead frames 611a, 612a connecting from the electrodes of the power semiconductor elements 21, 22 to the screw-fastening terminal portions 611, 612; and the sealing resin portion 7 that seals the connection portions between the semiconductor elements 21, 22 and the lead frames 611a, 612a, and regions around the connection portions; wherein, in the lead frames 611a, 612a, the opening portions 611b, 612b are respectively formed each at a position where the opening portion at least partly overlap, in planar view, with a portion of the insulative board 11 where the conductor layer 13 is not formed. Thus, it is possible to radiate UV light through the opening portions also to the ceramic portion of the insulative board placed on the back side of the lead frames, to thereby enhance the adhesive strength of the sealing resin to the ceramic.

Figure 9:
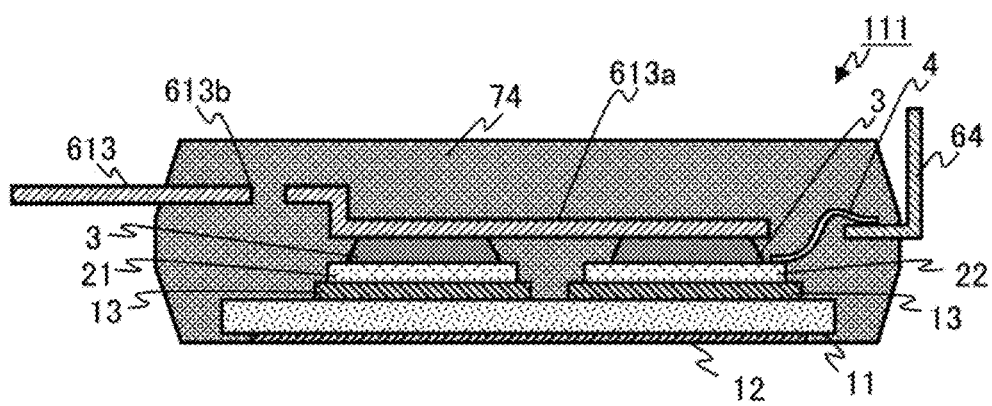
FIG. 9 is a sectional view showing another configuration of a power module according to Embodiment 1.

It is noted that, in the formation of sealing resin portion, the sealing resin portion 7 is formed using a potting resin; however this is not limitative. As shown in FIG. 9, a sealing resin portion 74 may be formed by sealing processing according to a transfer molding method using a molding resin.

Embodiment 2

Although the opening portions are formed in the root portions of the lead frames 611a, 612a in Embodiment 1, such a case will be described in Embodiment 2 where the root portions are further subjected to twisting processing.

Figure 10:
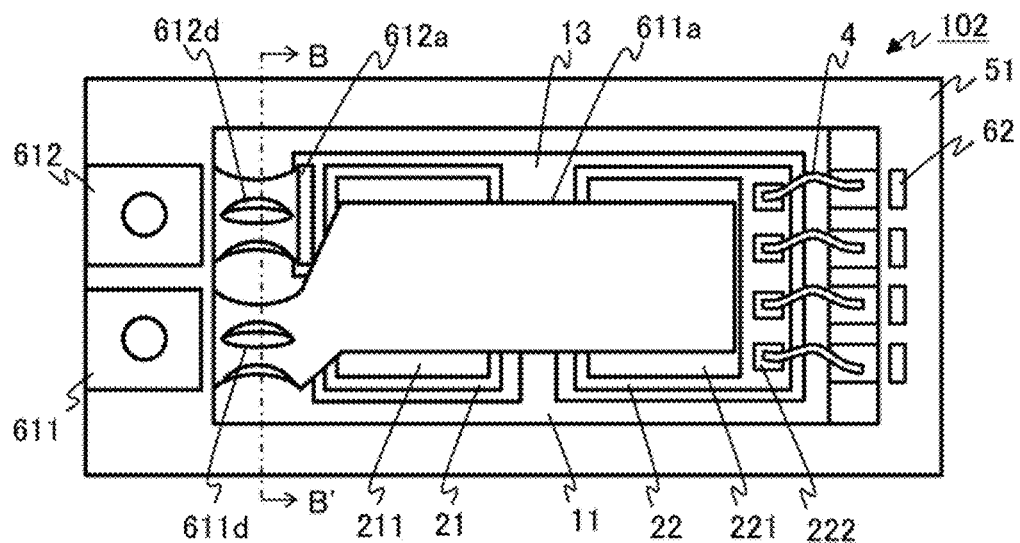
FIG. 10 is a top view showing a configuration of a power module according to Embodiment 2.
Figure 11:
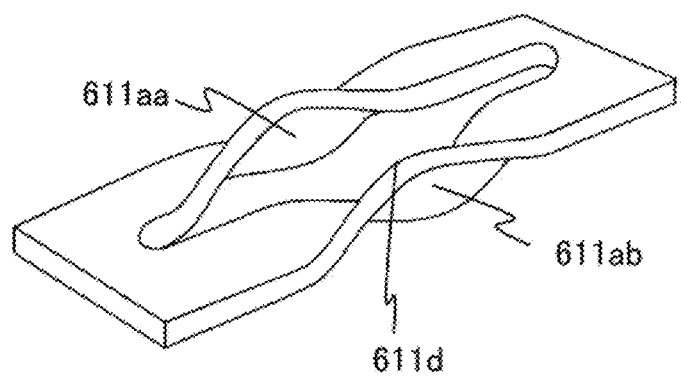
FIG. 11 is a perspective view showing a main part of the power module according to Embodiment 2.
Figure 12:
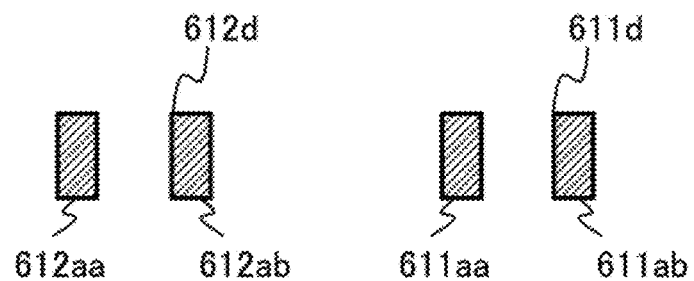
FIG. 12 is a sectional view showing the main part of the power module according to Embodiment 2.

FIG. 10 to FIG. 12 are diagrams showing a configuration of a power module 102 according to Embodiment 2. FIG. 10 is a top view, FIG. 11 is a perspective view of an opening portion 611d in the lead frame 611a of the power module 102 of FIG. 10, and FIG. 12 is a sectional view seen in the direction of arrows along the line B-B' in FIG. 10. As shown in FIG. 10 to FIG. 12, in the root portions of the lead frame 611a and the lead frame 612a, that project from the casing 51, slit-shaped opening portions 611d, 612d each having a width of 1 mm and a length of 5 mm are formed, and right and left-side portions of each of the silt-shaped opening portions 611d, 612d were subjected to twisting processing, to thereby provide cross-sections as shown in FIG. 12. The opening portions 611d, 612d are formed so that the ceramic portion of the insulative board 11 is exposed (can be seen). The other configuration and the fabrication method of the power module 102 according to Embodiment 2 are the same as those of the power module 101 of Embodiment 1 and thus, for the corresponding parts, the same numerals are given, so that the description thereof will be omitted.

What differs from Embodiment 1 is that, as shown in FIG. 12, in the lead frames 611a, 612a, their respective bifurcated portions 611aa, 611ab and 612aa, 612ab which sandwich the 1 mm-wide silt-shaped opening portions 611d, 612d therebetween, respectively, are twisted so as to be raised up, so that their slit widths are enlarged. As a result, it is possible to make the size of the opening portion equivalent to or larger than the 2 mm-diameter circular opening of Embodiment 1. This makes it possible to enlarge the least cross-section area of the frame, and thus to deal with the elevation in voltage and increase in current of the power module.

As described above, according to the power module 102 according to Embodiment 2, the opening portions 611d, 612d are slit shaped, and in the lead frames 611a, 612a, their respective bifurcated portions 611aa, 611ab and 612aa, 612ab which sandwich the silt-shaped opening portions 611d, 612d therebetween, respectively, are twisted so as to be raised up. Thus, it is possible not only to enlarge the opening portion but also to enlarge the least cross-section area of the frame, and thus to deal with the elevation in voltage and increase in current of the power module.

It is noted that, in Embodiment 2, the slit-shaped opening portions are provided one by one; however, this is not limitative. When plural slits are formed in each of the lead frames 611a, 612a, an effect similar to the above will also be achieved though depending on the width of that frame. Further, when the respective bifurcated portions 611aa, 611ab and 612aa, 612ab in the lead frames 611a, 612a, are laterally slid so as to expand the respective slits so that the bifurcated portions 611aa and 612ab are overlapped with each other, an effect similar to the above will also be achieved.

Figure 13:
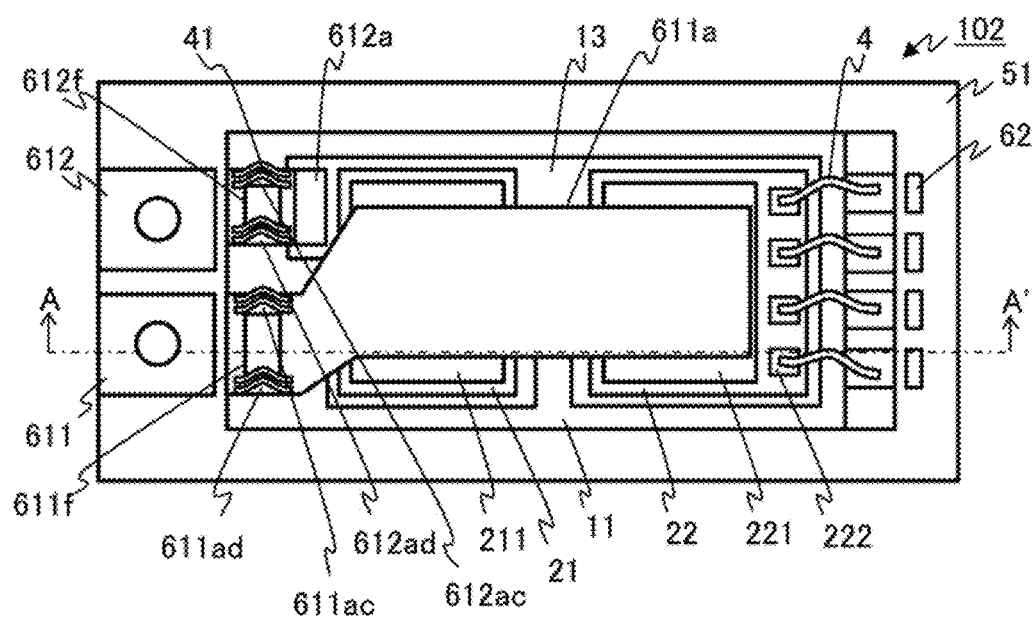
FIG. 13 is a top view showing another configuration of a power module according to Embodiment 2.
Figure 14:
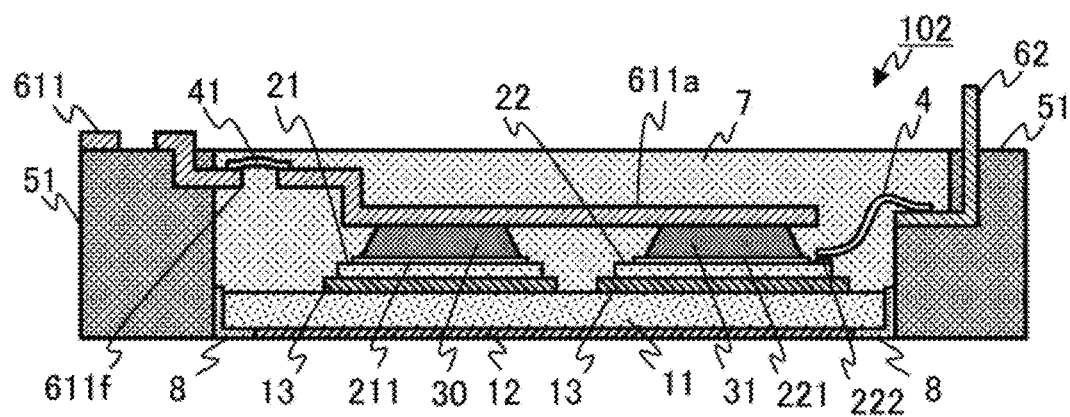
FIG. 14 is a sectional view showing the other configuration of the power module according to Embodiment 2.

Further, as shown in FIG. 13 and FIG. 14, in order to compensate such cross-section areas of the lead frames 611a, 612a that were lost due to the opening portions 611f, 612f, bonding wires 41 may be disposed around opening portions 611f, 612f in the lead frames 611a, 612a. FIG. 13 and FIG. 14 show another configuration of the power module 102 according to Embodiment 2. FIG. 13 is a top view and FIG. 14 is a sectional view seen in the direction of arrows along the line A-A' in FIG. 13. The bonding wires 41 are disposed so as to overlap with the bifurcated portions 611ac, 611ad, 612ac, 612ad in planar view, and thus not to cover the opening portions 611f, 612f when seen from the upper side, so that it is possible for these wires not to interfere with the UV radiation.

Figure 15:
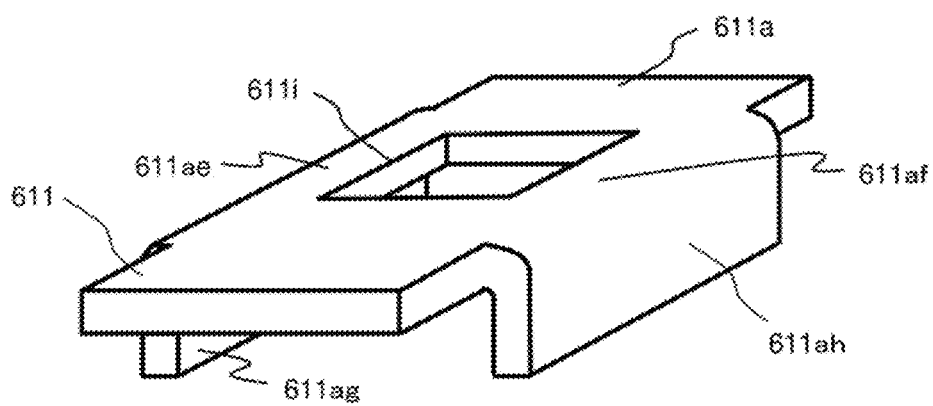
FIG. 15 is a perspective view showing a main part of another configuration of a power module according to Embodiment 2.
Figure 16:
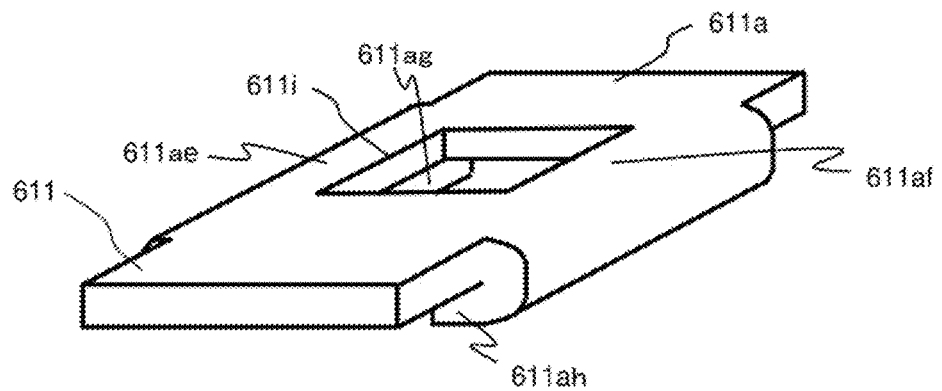
FIG. 16 is a perspective view showing a main part of another configuration of a power module according to Embodiment 2.

Further, as shown in FIG. 15, in order to compensate such a cross-section area of the lead frame 611a (or 612a, not shown) that was lost due to an opening portion 611i (or 612i, not shown), the bifurcated portions 611ae, 611af (or 612ae, 612af, not shown) beside the opening portion 611i (or 612i, not shown) may be widened to establish bypass portions 611ag, 611ah (or 612ag, 612ah, not shown), and when the bypass portions 611ag, 611ah (or 612ag, 612ah, not shown) are bent by 90 degrees toward the board or toward the opposite side of the board, it is possible for them not to interfere with the UV radiation. Further, when they are bent by 90 degrees toward the board, it is allowed to reduce the height of the liquid level of the sealing resin at the fabrication as compared to the case where they were bent by 90 degrees toward the opposite side of the board, so that the module can be made lightweight by the reduction in volume of the sealing resin. In contrast, when they were bent by 90 degrees toward the opposite side of the board, it becomes possible to suppress bubble inclusion at the time of injection of the sealing resin. Furthermore, when the bypass portions 611ag, 611ah (or 612ag, 612ah, not shown) are folded by 180 degrees as shown in FIG. 16, it is possible for them not to interfere with the UV radiation in an oblique direction.

Embodiment 3

In Embodiment 1 and Embodiment 2, the opening portions are formed in the root portions of the lead frames 611a, 612a, whereas in Embodiment 3, such a case will be described where bent portions are formed in the root portions.

Figure 17:
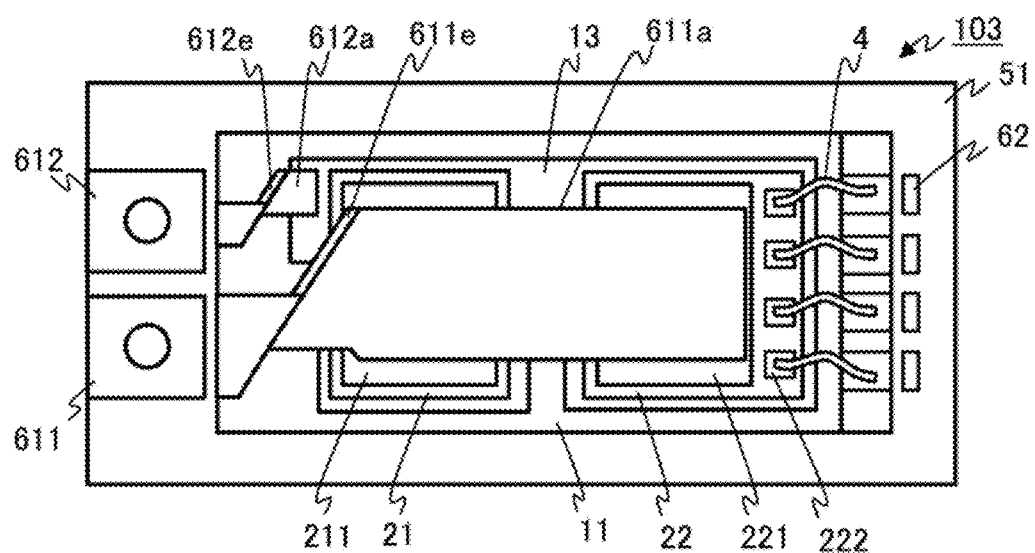
FIG. 17 is a top view showing a configuration of a power module according to Embodiment 3.
Figure 18:
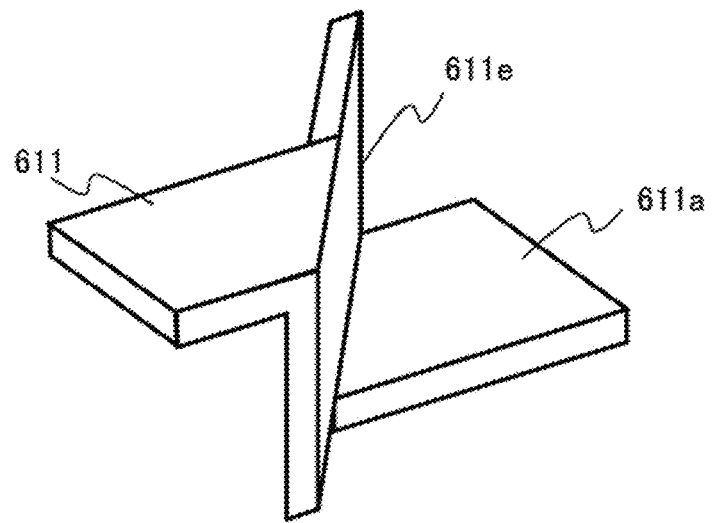
FIG. 18 is a perspective view showing a main part of the power module according to Embodiment 3.

FIG. 17 and FIG. 18 are diagrams showing a configuration of a power module 103 according to Embodiment 3. FIG. 17 is a top view, and FIG. 18 is a perspective view of a bent portion 611e in the lead frame 611a of the power module 103 in FIG. 17. As shown in FIG. 17 and FIG. 18, at positions where the lead frame 611a and the lead frame 612a overlap the insulative board 11 and in the root portions that project from the casing 51, bent portions 611e, 612e are formed that were bent each along a direction at 45° as seen from above with respect to the formation direction (longitudinal direction) of the lead frame, and in a direction perpendicular to the insulative board. The other configuration and the fabrication method of the power module 103 according to Embodiment 3 are the same as those of the power module 101 of Embodiment 1 and thus, for the corresponding parts, the same numerals are given, so that the description thereof will be omitted.

With such a configuration, it becomes possible to suppress shielding of UV light because the projected area can be reduced as compared to the case where the root portions of the lead frame 611a and the lead frame 612a are formed flatly.

As described above, according to the power module 103 according to Embodiment 3, in the root portions of the lead frame 611a and the lead frame 612a, that project from the casing 51, the bent portions 611e, 612e are formed that were bent each along a direction at 45° as seen from above with respect to the formation direction of the lead frame, and in a direction perpendicular to the insulative board. Thus, it becomes possible to suppress shielding of UV light because the projected area can be reduced as compared to the case of the flat formation. Note that the direction along which they were bent is herein set at 45=; however, there is no restriction on its angle if it is a bendable angle by press working, and when it is in the range of 30 to 60°, an effect similar to the above will be achieved.

Embodiment 4

Embodiment 4 is an embodiment of an electric power conversion device in which the power module according to the foregoing Embodiments 1 to 3 is applied. Although the electric power conversion device in this application is not limited to a specific one, in the following, such a case will be described as Embodiment 4 where the present application is applied to a three-phase inverter.

Figure 19:
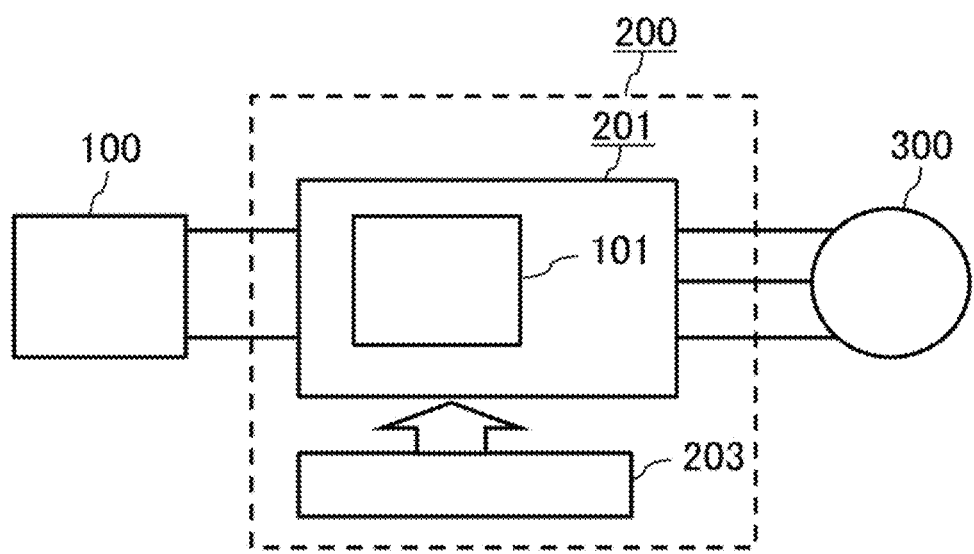
FIG. 19 a block diagram showing a configuration of a power conversion system in which an electric power conversion device according to Embodiment 4 is applied.

FIG. 19 a block diagram showing a configuration of a power conversion system in which an electric power conversion device according to Embodiment 4 is applied.

The power conversion system shown in FIG. 19 is configured with a power source 100, an electric power conversion device 200 and a load 300. The power source 100 is a DC power source, which supplies DC power to the electric power conversion device 200. The power source 100 can be configured with any one of various elements and, for example, it may be configured with a DC system, a solar battery or a storage battery, and may also be configured with a rectifier circuit and an AC/DC converter that are connected to an AC system. Further, the power source 100 may be configured with a DC/DC converter that converts DC power outputted from a DC system into specified power.

The electric power conversion device 200 is a three-phase inverter connected between the power source 100 and the load 300, and converts the DC power supplied from the power source 100 to AC power, and supplies the AC power to the load 300. As shown in FIG. 19, the electric power conversion device 200 includes a main conversion circuit 201 for converting the DC power into the AC power and then outputting that power, and a control circuit 203 for outputting to the main conversion circuit 201, control signals for controlling the main conversion circuit 201.

The load 300 is a three-phase electric motor to be driven by the AC power supplied from the electric power conversion device 200. It is noted that the use of the load 300 is not limited to a specific one, and thus the load may be an electric motor installed in every type of electric apparatus and is used as an electric motor for a hybrid car, an electric-powered car, a railroad car, an elevator or an air-conditioning apparatus, for example.

In the following, the details of the electric power conversion device 200 will be described. The main conversion circuit 201 includes switching elements and freewheel diodes (not shown), and when switching of the switching elements are performed, the DC power supplied from the power source 100 is converted into the AC power which is then supplied to the load 300. Although the specific circuit configuration of the main conversion circuit 201 is exemplified by various configurations, the main conversion circuit 201 according to Embodiment 4 is a two-level three-phase full bridge circuit, and can be configured with six switching elements and six freewheel diodes arranged in reverse-parallel to the respective switching elements. The respective switching elements and the respective freewheel diodes in the main conversion circuit 201 are each configured by the power module corresponding to any one of the foregoing Embodiments 1 to 3 (here, description will be made using the power module 101). In the six switching elements, each set of two switching elements are serially connected with each other to thereby constitute a set of upper-and-lower arms, and the respective sets of upper-and-lower arms constitute the respective phases (U-phase, V-phase, W-phase) of the full bridge circuit. In addition, output terminals of the respective sets of upper-and-lower arms, namely, three output terminals of the main conversion circuit 201 are connected to the load 300.

Further, while the main conversion circuit 201 is provided with a driver circuit (not shown) for driving the respective switching elements, the driver circuit may be built into the power module 101, and the main conversion circuit may be configured that it is provided with the driver circuit separately from the power module 101. The driver circuit generates driving signals for driving the switching elements of the main conversion circuit 201, and supplies these signals to the control electrodes of the switching elements of the main conversion circuit 201. Specifically, according to the control signal from the control circuit 203 to be described later, the driving signal for bringing the switching element into an ON state or the driving signal for bringing the switching element into an OFF state is outputted to the control electrode of each of the switching elements. When the switching element is to be maintained in an ON state, the driving signal is a voltage signal (ON signal) that is equal to or more than a threshold voltage of the switching element, and when the switching element is to be maintained in an OFF state, the driving signal is a voltage signal (OFF signal) that is less than the threshold voltage of the switching element.

The control circuit 203 controls the switching elements of the main conversion circuit 201 so that intended power is supplied to the load 300. Specifically, based on the power to be applied to the load 300, the control circuit calculates a time period (ON time) in which each switching element is to be in an ON state. For example, the control circuit can control the main conversion circuit 201 using PWM control in which the ON time of the switching element is modulated according to a voltage to be outputted. Further, the control circuit outputs control commands (control signals) to the driver circuit included in the main conversion circuit 201 so that, at every point in time, the ON signal is outputted to the switching element to be brought into an ON state and the OFF signal is outputted to the switching element to be brought into an OFF state. According to the control signals, the driver circuit outputs the ON signal or the OFF signal, as a driving signal, to the control electrode of each of the switching elements.

In the electric power conversion device according to Embodiment 4, the power modules according to Embodiments 1 to 3 are applied as the respective switching elements and freewheel diodes of the main conversion circuit 201, and thus it is possible to achieve enhancing the reliability.

In Embodiment 4, an example has been described in which the present application is applied to a two-level three-phase inverter; however, the present application is not limited to this example, and may be applied to various electric power conversion devices. In Embodiment 4, a two-level electric power conversion device is provided; however, it may instead be a three-level or multi-level electric power conversion device, and the present application may be applied to a single-phase inverter when power is to be supplied to a single-phase load. Further, it is also allowable that the present application is applied to a DC/DC converter or an AC/DC converter when power is to be supplied to a DC load or the like.

Further, the electric power conversion device in which the present application is applied, is not limited to the above-described case where the load is an electric motor, and may be used as a power-supply device for, for example, an electric-discharge machining machine, a laser machining machine, an induction-heating cooking machine, a contact-less power-feeding system or the like. Moreover, it is also allowed to be used as a power conditioner for a solar photovoltaic system, a power storage system or the like.

In this application, a variety of exemplary embodiments and examples are described; however, every characteristic, configuration or function that is described in one or more embodiments, is not limited to being applied to a specific embodiment, and may be applied singularly or in any of various combinations thereof to an embodiment. Accordingly, an infinite number of modified examples that are not exemplified here are supposed within the technical scope disclosed in the present description. For example, such cases shall be included where at least one configuration element is modified; where any configuration element is added or omitted; and additionally where at least one configuration element is extracted and combined with a configuration element of another embodiment.

DESCRIPTION OF REFERENCE NUMERALS AND SIGNS 7, 74: sealing resin portion, 11: insulative board, 21, 22: power semiconductor element, 30, 31: solder-bonding portion, 611a, 612a, 613a: lead frame (electrode plate), 611, 612: screw-fastening terminal portion, 611b, 611c, 611d, 611f, 611i, 612b, 612c, 612d, 612f, 612i, 613b: opening portion, 101, 102, 103, 111: power module, 200: electric power conversion device, 201: main conversion circuit, 203: control circuit, 300: load.

The invention claimed is:

1. A power module, comprising:
an insulative board in which a conductor layer is formed on a ceramic plate;
a semiconductor element placed on the insulative board;
an electrode plate in a plate shape connected to a front-surface electrode of the semiconductor element; and
a sealing resin portion that seals the semiconductor element and at least a part of the electrode plate;
wherein an opening portion is formed in the electrode plate at a position where the opening portion at least partly overlaps, in planar view, with a portion of the insulative board where the conductor layer is not formed; and
wherein the opening portion in the electrode plate has an area equivalent to a circle having a diameter not less than 160% of a thickness of the electrode plate, and is sealed in the sealing resin portion.

2. The power module according to claim 1, wherein the opening portion is slit shaped and, in the electrode plate, bifurcated portions which sandwich the slit-shaped opening portion therebetween are each twisted so as to be raised up.

3. The power module according to claim 1, wherein metal wirings are provided by wire bonding on the electrode plate at positions where the wirings overlap, in planar view, with bifurcated portions in the electrode plate which sandwich the opening portion therebetween.

4. The power module according to claim 1, wherein, along bifurcated portions in the electrode plate which sandwich the opening portion therebetween, widened portions for extending these bifurcated portions were formed and bent toward the insulative board or toward an opposite side of the insulative board.

5. The power module according to claim 1, wherein, along bifurcated portions in the electrode plate which sandwich the opening portion therebetween, widened portions for extending these bifurcated portions were formed and folded to positions where the widened portions overlap, in planar view, with these bifurcated portions.

6. The power module according to claim 1, wherein the semiconductor element is formed of a wide bandgap semiconductor material.

7. The power module according to claim 6, wherein the wide bandgap semiconductor material is silicon carbide, a gallium nitride-based material or diamond.

8. An electric power conversion device having the power module according to claim 1, comprising:
a main conversion circuit for outputting inputted power after converting that power; and
a control circuit for outputting to the main conversion circuit, a control signal for controlling the main conversion circuit.

9. A power module, comprising:
an insulative board in which a conductor layer is formed on a ceramic plate;
a semiconductor element placed on the insulative board;
an electrode plate in a plate shape electrically connected to the conductor layer; and
a sealing resin portion that seals the conductor layer and at least a part of the electrode plate;
wherein an opening portion is formed in the electrode plate at a position where the opening portion at least partly overlaps, in planar view, with a portion of the insulative board where the conductor layer is not formed; and
wherein the opening portion in the electrode plate has an area equivalent to a circle having a diameter not less than 160% of a thickness of the electrode plate, and is sealed in the sealing resin portion.

10. The power module according to claim 9, wherein the opening portion is slit shaped and, in the electrode plate, bifurcated portions which sandwich the slit-shaped opening portion therebetween are each twisted so as to be raised up.

11. The power module according to claim 9, wherein the semiconductor element is formed of a wide bandgap semiconductor material.

12. The power module according to claim 11, wherein the wide bandgap semiconductor material is silicon carbide, a gallium nitride-based material or diamond.

13. An electric power conversion device having the power module according to claim 9, comprising:
a main conversion circuit for outputting inputted power after converting that power; and a control circuit for outputting to the main conversion circuit, a control signal for controlling the main conversion circuit.

14. A power module, comprising:
an insulative board formed of ceramic;
a semiconductor element placed on the insulative board;
an electrode plate in a plate shape connecting from an electrode of the semiconductor element to outside thereof; and
a sealing resin portion that seals a connection portion between the semiconductor element and the electrode plate, and a region around the connection portion;
wherein an opening portion is formed in the electrode plate at a position overlapping a portion of the insulative board in the region around the connection portion so that a ceramic portion of the insulative board can be seen through the opening portion; and
wherein the opening portion in the electrode plate has an area equivalent to a circle having a diameter not less than 160% of a thickness of the electrode plate, and is sealed in the sealing resin portion.

15. The power module according to claim 14, wherein the opening portion is slit shaped and, in the electrode plate, bifurcated portions which sandwich the slit-shaped opening portion therebetween are each twisted so as to be raised up.

16. The power module according to claim 14, wherein the semiconductor element is formed of a wide bandgap semiconductor material.

17. The power module according to claim 16, wherein the wide bandgap semiconductor material is silicon carbide, a gallium nitride-based material or diamond.

18. An electric power conversion device having the power module according to claim 14, comprising:
a main conversion circuit for outputting inputted power after converting that power; and
a control circuit for outputting to the main conversion circuit, a control signal for controlling the main conversion circuit.

19. A method for producing a power module, including:
a step of bonding a semiconductor element onto an insulative board in which a conductor layer is formed on a ceramic plate;
a step of bonding together an electrode of the semiconductor element and an electrode plate in a plate shape, said electrode plate having an opening portion formed at a position where the opening portion at least partly overlaps, in planar view, with a portion of the insulative board where the conductor layer is not formed; and
a step of pouring a sealing resin to a connection portion between the semiconductor element and the electrode plate, and a region around the connection portion, in a state where a portion in the insulative board that is placed on a back side of a root portion of the electrode plate, is excited by radiation of UV light through the opening portion before formation of the sealing resin portion, to thereby seal said connection portion and said region.

* * * * *